United States Patent
Joo et al.

(10) Patent No.: US 9,246,060 B2
(45) Date of Patent: Jan. 26, 2016

(54) LIGHT EMITTING DEVICES AND PACKAGES AND RELATED METHODS WITH ELECTRODE MARKS ON LEADS

(71) Applicant: Cree, Inc., Durham, NC (US)

(72) Inventors: Sung Chul Joo, Cary, NC (US); Christopher P. Hussell, Cary, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 13/762,912

(22) Filed: Feb. 8, 2013

(65) Prior Publication Data

US 2013/0215434 A1 Aug. 22, 2013

Related U.S. Application Data

(60) Provisional application No. 61/597,534, filed on Feb. 10, 2012.

(51) Int. Cl.
  *H01L 33/38* (2010.01)
  *G01B 11/24* (2006.01)
  *H01L 33/62* (2010.01)
  *H01L 33/48* (2010.01)

(52) U.S. Cl.
  CPC .............. *H01L 33/38* (2013.01); *G01B 11/24* (2013.01); *H01L 33/62* (2013.01); *H01L 33/486* (2013.01); *H01L 2224/48* (2013.01)

(58) Field of Classification Search
  CPC .............. H01L 2924/00014; H01L 2924/00; H01L 2224/73265; H01L 2224/48247; H01L 2224/48091; H01L 2924/00012; H01L 33/38
  USPC ..................... 257/666, 99, 797, 433
  See application file for complete search history.

(56) References Cited

U.S. PATENT DOCUMENTS

| | | | | |
|---|---|---|---|---|
| 2005/0077623 A1* | 4/2005 | Roberts et al. | ............... | 257/724 |
| 2005/0133810 A1* | 6/2005 | Roberts et al. | ............... | 257/99 |
| 2008/0224162 A1* | 9/2008 | Min et al. | ............... | 257/98 |
| 2009/0108281 A1* | 4/2009 | Keller et al. | ............... | 257/98 |
| 2010/0140634 A1* | 6/2010 | van de Ven et al. | ............. | 257/88 |

(Continued)

FOREIGN PATENT DOCUMENTS

| | | |
|---|---|---|
| EP | 2812930 | 12/2014 |
| JP | 2005-101283 | 4/2005 |
| JP | 2006-279069 | 10/2006 |

(Continued)

OTHER PUBLICATIONS

International Search Report and Written Opinion for Application No. PCT/US2013/025312 dated Jun. 2, 2013.

*Primary Examiner* — Chuong A Luu
*Assistant Examiner* — Rodolfo Fortich
(74) *Attorney, Agent, or Firm* — Jenkins, Wilson, Taylor & Hunt, P.A.

(57) ABSTRACT

Light emitting devices, packages and related methods are disclosed with electrical leads with one or more indicators. A package can include a leadframe that can include at least a first lead and a second lead. The first lead can include a first end for electrical connection to at least one light emitting device and a second end extending toward a first side of the package. The second lead can include a first end for electrical connection to at least one light emitting device and a second end extending toward a second side of the package. One or both of the second end of the first lead or the second end of the second lead can comprise an indicator serving as an identifier.

18 Claims, 4 Drawing Sheets

(56) References Cited

U.S. PATENT DOCUMENTS

2011/0220955 A1* 9/2011 Park .............................. 257/99
2012/0188172 A1* 7/2012 Fong ............................. 345/173

FOREIGN PATENT DOCUMENTS

| JP | 2011-044565 | 3/2011 |
| KR | 10-2005-0111297 | 11/2005 |

* cited by examiner

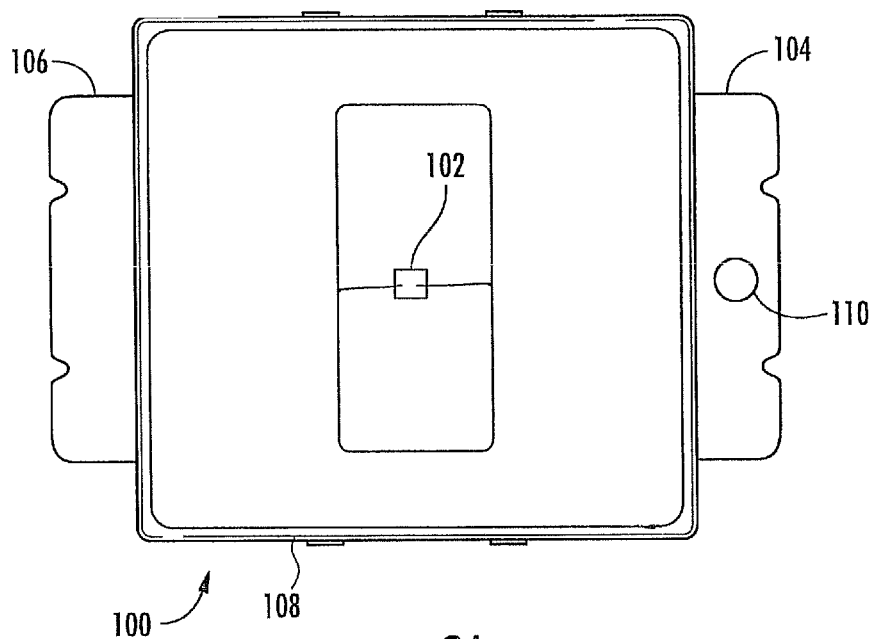
FIG. 2A
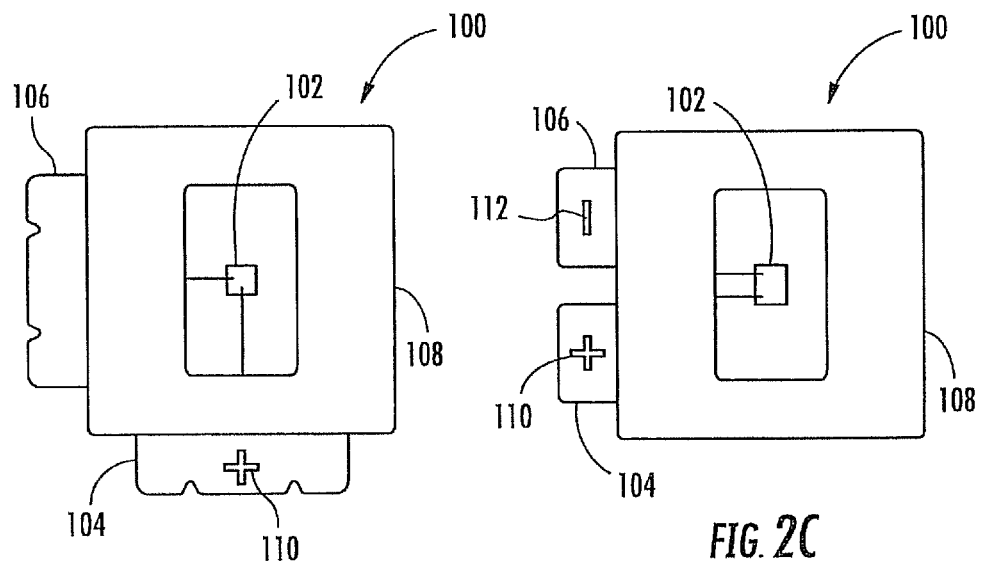
FIG. 2B
FIG. 2C

LIGHT EMITTING DEVICES AND PACKAGES AND RELATED METHODS WITH ELECTRODE MARKS ON LEADS

CROSS REFERENCE TO RELATED APPLICATION

The present application claims the benefit of U.S. Patent Application Ser. No. 61/597,534, filed Feb. 10, 2012, the disclosure of which is incorporated by reference herein in its entirety.

TECHNICAL FIELD

The subject matter disclosed herein relates generally to light emitting devices and methods. More particularly, the subject matter disclosed herein relates to light emitting devices, packages and related methods with electrode indicators on metal leads which can yield increased brightness.

BACKGROUND

Light emitting devices, such as light emitting diodes (LEDs), are widely used in consumer applications. Generally, one or more LED dies or chips are mounted within an LED package, which can include a packaging material with metal leads (i.e., connected to the LED dies from outside circuits). To differentiate the polarity of the metal leads, an electrode mark is often provided on the packaging material to identify one or both of the positive electrode terminal (e.g., anode) or the negative electrode terminal (e.g., cathode). For instance, as shown in FIG. 1, an LED package 10 can comprise one or more LEDs 12 connected to a first lead 14 and a second lead 16. A plastic or other type package 18 can be provided to surround and protect LEDs 12. A cutout, notch, or other electrode mark, generally designated 20, can identify the one of first or second leads 14 or 16 nearest to the mark as being the positive or negative electrode terminal.

Unfortunately, however, these electrode marks can limit the available optic area of the LED package, and thus can present an impediment to maximizing the brightness of the package. Some manufacturers have attempted to limit this impediment by making one or two small electrode marks on the package corner, but even these small marks can still limit the optic area. In addition, small marks can be difficult to identify, thereby at least partially defeating the purpose for which the marks are added. As a result, detection systems having greater precision and/or higher magnification need to be used to identify the polarity of devices using such marks.

Thus, despite availability of various light emitting devices and packages, a need remains for further solutions for identifying electrodes and also for producing brighter devices. In one aspect, brighter devices can be achieved by reducing the occurrence of defects during encapsulation of the devices. Light emitting devices, packages and related methods described herein can advantageously enhance light output performance while promoting ease of manufacture.

SUMMARY

In accordance with this disclosure, novel light emitting devices, packages and related methods are provided that are well suited for a variety of applications, including industrial and commercial lighting products. It is, therefore, an object of the present disclosure herein to provide light emitting devices and packages with improved identification of one or more electrodes that can yield improved and brighter light emitting devices, in part by increasing optic area.

These and other objects of the present disclosure as can become apparent from the disclosure herein are achieved, at least in whole or in part, by the subject matter disclosed herein.

BRIEF DESCRIPTION OF THE DRAWINGS

The features and advantages of the present subject matter will be more readily understood from the following detailed description which should be read in conjunction with the accompanying drawings that are given merely by way of explanatory and non-limiting example, and in which:

FIGS. 2A-2C are plan views of external lead configurations for a light emitting device and package according to an embodiment of the presently disclosed subject matter;

DETAILED DESCRIPTION

Figure 1:
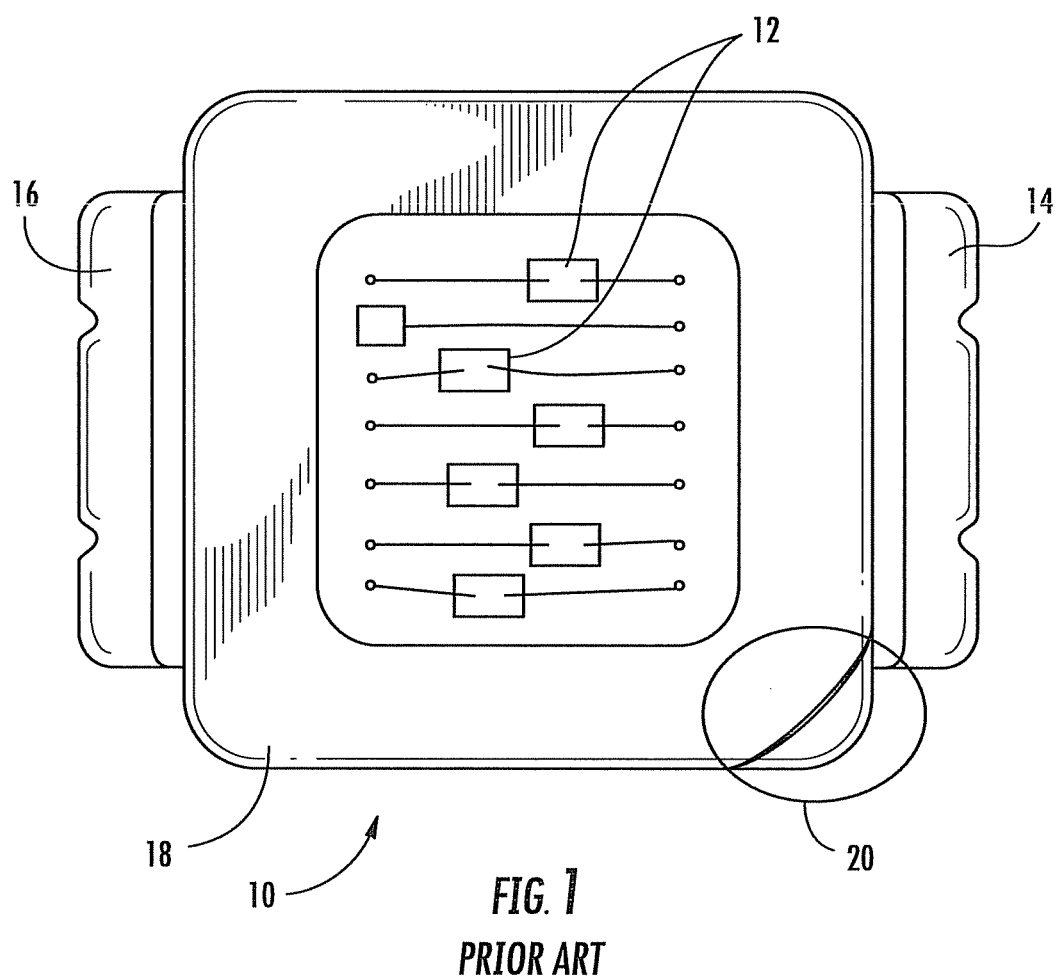
FIG. 1 is a plan view of a light emitting package having a conventional external lead configuration.

The present subject matter provides light emitting devices, packages and related methods having electrode indicators and increased brightness via increased optic area. In one aspect, the present subject matter provides a light emitting die (LED) device and package without any indicator such as one or more identifying notches or electrode marks on the package. Instead, one or more indicators such as identifying shapes and/or marks can be provided on one or more of the external leads themselves and serve as identifiers, and these can be used alone to identify and distinguish one or more metal leads of the device as further described herein. In this way, a comparatively larger optic area can be realized for a given package size. As a result, an LED device and package according to the subject matter disclosed herein can be brighter in comparison to a conventional device having the same footprint size.

For instance, referring to FIGS. 2A-2C, an LED device and package, generally designated 100, can be provided. LED package 100 can comprise at least one or more LED 102 connected to a leadframe comprising at least a first lead 104 and a second lead 106 each having a first end electrically connected to the at least one LED 102. In this way, first and second leads 104 and 106 can function as positive and negative electrode terminals for LED package 100. A package 108 can at least partially, and in some aspects even at least substantially, surround and protect LED 102. Package 108 can for example comprise a planar portion with the at least one LED 102 being positioned on a surface of package 108. First lead 104 can comprise a second end extending toward and in some aspects beyond a first side of package 108, and second lead 106 can similarly comprise a second end extending toward and in some aspects beyond a second side of package 108. Although FIG. 2A shows first and second leads 104 and 106 extending from opposing sides of package 108, first and second leads 104 and 106 can be disposed on any side of package 108. For example, first and second leads 104 and 106 can be disposed on adjacent sides of package 108 (See, e.g., FIG. 2B) or on the same side of package 108 (See, e.g., FIG. 2C).

Contrary to conventional devices, rather than providing a cutout or mark on package 108, first and second leads 104 and 106 can themselves have an indicator and can for example without limitation be marked, notched, or otherwise labeled as an indicator to differentiate them from one another. Specifically, for example, as shown in FIGS. 2A-2C, the second end of one of first or second leads 104 or 106 can for example comprise an indicator generally designated 110 that can be a notch or a cutout. In particular, in the configuration shown in FIG. 2A, indicator 110 can comprise a circular cutout on the second end of first lead 104. Any other shape or configuration for indicator 110 can be utilized to similarly serve as an indicator or identifying mark, such as for example a semi-circular cutout, a "+" sign or "−" sign, or any other shape or symbol that can be used to distinguish one lead from the other. For example, as shown in FIG. 2B, indicator 110 can be in the shape of a "+" sign to indicate that first lead 104 is a positive electrode terminal for LED package 100.

Alternatively or in addition, an indicator or identifying mark can also be provided on the second end of second lead 106, and the indicator provided on the second end of second lead 106 can be different from the indicator or identifying mark provided on the second end of first lead 104. For example, as shown in FIG. 2C, the indicator or identifying mark provided on the second end of first lead 104 (e.g., indicator 110) can comprise a "+" sign where first lead 104 is the positive electrode terminal of LED package 100, whereas the second end of second lead 106 can comprise a second indicator 112 that can for example be a cutout or notch in the shape of a "−" sign where second lead 106 can be the negative electrode terminal of LED package 100.

Figure 3:
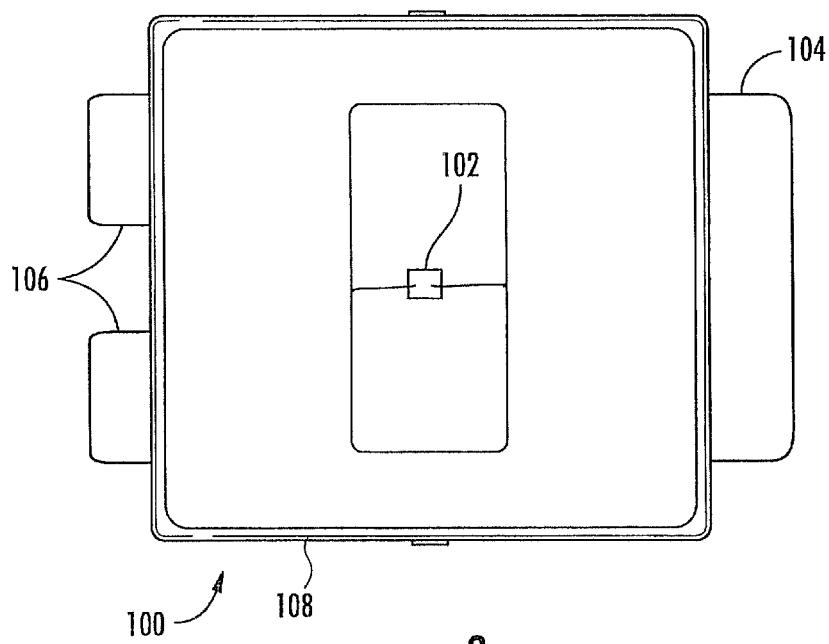
FIG. 3 is a plan view of an external lead configuration for a light emitting device and package according to another embodiment of the presently disclosed subject matter.

In an alternative configuration, rather than providing an indicator such as a notch or cutout on one or both of first or second leads 104 or 106, the leads themselves can have different shapes and/or configurations. For example, referring to FIG. 3, the shapes of first and second leads 104 and 106 can be asymmetric such that they can be distinguished solely by one or both of their shapes rather than by the inclusion of an indicator or identifying mark. Specifically, in the configuration shown in FIG. 3, the second end of first electrode 104 can comprise a unitary electrode that can extend across substantially the entire width of one side of package 108, whereas the second end of second electrode 106 can be divided into multiple prongs. In this way, the visual differences between the shapes of first and second leads 104 and 106 can alone be the indicator or identifier used to distinguish the leads from each other.

Figure 4:
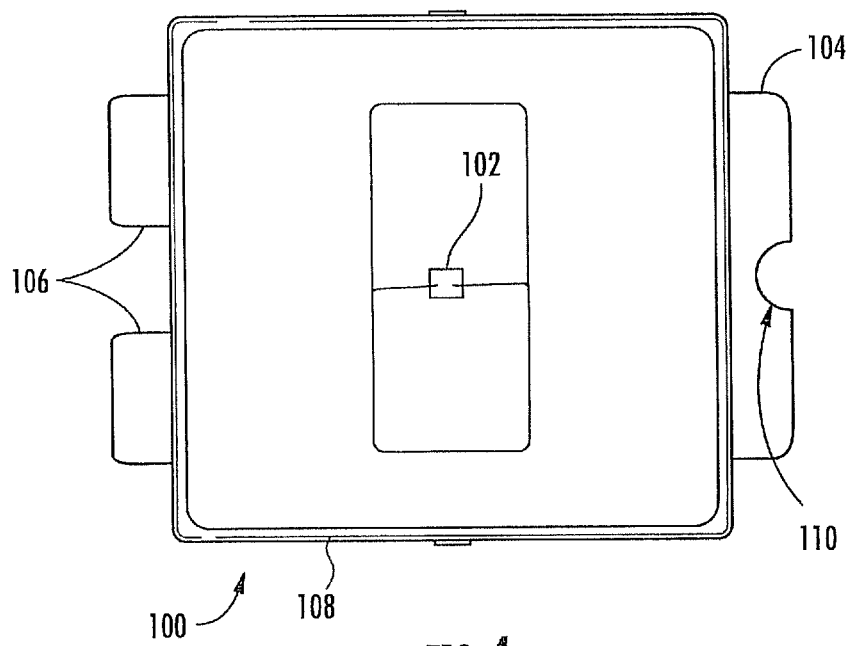
FIG. 4 is a plan view of an external lead configuration for a light emitting device and package according to yet another embodiment of the presently disclosed subject matter.

In yet a further alternative configuration shown in FIG. 4, both an indicator and one or more lead shapes, such as for example asymmetric lead shapes, can be used to differentiate the leads from each other. Specifically, for example, the second end of first lead 104 can comprise a substantially unitary electrode end having an indicator 110 that can be semi-circular. In contrast, the second end of second lead 106 can comprise a split electrode. In this way, first and second leads 104 and 106 can be distinguished by multiple forms of identification.

Regardless of the specific configuration of LED package 100, by providing identifying marks on the leads themselves and/or by using asymmetric lead shapes to distinguish first and second leads 104 and 106 from each other, the design of package 108 can be more focused on functional characteristics of LED package 100. Specifically, for example, rather than providing electrode marks on one or more portions of package 108, the entire shape of package 108 can be configured for optimized brightness since the entire footprint of package 108 can be configured for maximum optic area.

Further in this regard, the indicator or identifying marks or lead shapes can be readily identified using conventional detector systems without compromising the optic area.

The present subject matter can be embodied in other forms without departure from the spirit and essential characteristics thereof. The embodiments described therefore are to be considered in all respects as illustrative and not restrictive. Although the present subject matter has been described in terms of certain preferred embodiments, other embodiments that are apparent to those of ordinary skill in the art are also within the scope of the present subject matter.

What is claimed is:

1. A light emitting device comprising:
    a package for association with at least one light emitting device, wherein the package is devoid of identifying notches or electrode marks thereon, and wherein the package has a shape that is configured to optimize brightness of the at least one light emitting device for a footprint size of the package;
    a leadframe comprising at least a first lead and a second lead, the first lead comprising a first end for electrically connecting to the at least one light emitting device and a second end extending beyond a first side of the package, the second lead comprising a first end for electrically connecting to the at least one light emitting device and a second end extending beyond a second side of the package; and
    one or both of the second end of the first lead or the second end of the second lead extending across substantially an entire width of the first side or the second side of the package, respectively, and comprising an indicator serving as an identifier that is external from the package.

2. The light emitting device of claim 1, wherein the first lead comprises a positive electrode terminal and the second lead comprises a negative electrode terminal.

3. The light emitting device of claim 1, comprising at least one light emitting device electrically connected to the first and second leads.

4. The light emitting device of claim 1, wherein the indicator comprises a cutout or notch in the second end of the first lead or the second end of the second lead.

5. The light emitting device of claim 4, wherein the notch comprises a circular or semi-circular cutout on the second end of the first lead or the second end of the second lead.

6. The light emitting device of claim 1, wherein the second end of the first lead or the second end of the second lead comprise different indicators.

7. The light emitting device of claim 1, wherein a shape of the second end of the first lead is different than a shape of the second end of the second lead.

8. A light emitting device comprising:
    a package for association with at least one light emitting device, wherein the package is devoid of identifying notches or electrode marks thereon, and wherein the package has a shape that is configured to optimize brightness of the at least one light emitting device for a footprint size of the package; and
    a leadframe comprising at least a first lead and a second lead, the first lead comprising a first end for electrically connecting to the at least one light emitting device and a second end extending beyond and across substantially an entire width of a first side of the package, the second lead comprising a first end for electrically connecting to the at least one light emitting device and a second end extending beyond a second side of the package;
    wherein a shape of a portion of the second end of the first lead that is external from the package is different than a shape of a portion of the second end of the second lead that is external from the package.

9. The light emitting device of claim 8, wherein the second end of the first lead is on an opposing side of the package with respect to the second end of the second lead.

10. The light emitting device of claim 8, wherein the second end of the first lead is on an adjacent side of the package with respect to the second end of the second lead.

11. The light emitting device of claim 8, wherein the second end of the first lead is on a same side of the package with respect to the second end of the second lead.

12. The light emitting device of claim 8, wherein the second end of the first lead has a first size and the second end of the second lead has a second size and wherein the first size is different than the second size.

13. The light emitting device of claim 8, wherein at least one of the second end of the first lead or the second end of the second lead is divided into at least two sections.

14. The light emitting device of claim 8, wherein at least one of the second end of the first lead or the second end of the second lead comprises one of a cutout, a notch, or an identifying mark.

15. A light emitting device comprising:
a package for association with at least one light emitting device; and
a leadframe comprising at least a first lead and a second lead, the first lead comprising a first end for electrically connecting to the at least one light emitting device and a second end extending beyond and across substantially an entire width of a first side of the package, the second lead comprising a first end for electrically connecting to the at least one light emitting device and a second end extending beyond a second side of the package;
wherein a portion of the second end of the first lead that is external from the package and a portion of the second end of the second lead that is external from the package are asymmetric.

16. The light emitting device of claim 15 wherein the second end of the second lead is divided into multiple prongs.

17. The light emitting device of claim 16 wherein the second end of the first lead is unitary.

18. The light emitting device of claim 15 wherein the package is devoid of identifying notches or electrode marks thereon.

* * * * *